US009668356B2

United States Patent
Syal et al.

(10) Patent No.: US 9,668,356 B2
(45) Date of Patent: May 30, 2017

(54) METHOD AND APPARATUS FOR ELECTRICAL KEYING OF AN INTEGRATED CIRCUIT PACKAGE HAVING ROTATIONALLY SYMMETRIC FOOTPRINT

(71) Applicant: SIERRA WIRELESS, INC., Richmond (CA)

(72) Inventors: Ashish Syal, Vancouver (CA); Paul David Newman, North Vancouver (CA)

(73) Assignee: Sierra Wireless, Inc., Richmond, British Columbia (CA)

( * ) Notice: Subject to any disclaimer, the term of this patent is extended or adjusted under 35 U.S.C. 154(b) by 696 days.

(21) Appl. No.: 14/043,435

(22) Filed: Oct. 1, 2013

(65) Prior Publication Data

US 2015/0091390 A1    Apr. 2, 2015

(51) Int. Cl.
*G01R 31/04* (2006.01)
*H01R 13/641* (2006.01)
(Continued)

(52) U.S. Cl.
CPC ........... *H05K 3/303* (2013.01); *G01R 31/043* (2013.01); *H01R 13/641* (2013.01);
(Continued)

(58) Field of Classification Search
CPC .... G01R 31/04; G01R 31/041; G01R 31/043; G01R 31/046; H01R 13/64; H01R 13/641;
(Continued)

(56) References Cited

U.S. PATENT DOCUMENTS 3,191,095 A    6/1965   Hefti et al.
3,414,806 A   12/1968   Carr et al.
(Continued)

FOREIGN PATENT DOCUMENTS

WO    WO 2015/048892 A1    4/2015

OTHER PUBLICATIONS

Syal, Ashish et al., International Search Report and Written Opinion of PCT/CA2014/050934 (publication No. WO 2015/048892 A1), Apr. 9, 2015.
(Continued)

*Primary Examiner* — Levi Gannon
(74) *Attorney, Agent, or Firm* — Saliwanchik, Lloyd & Eisenschenk

(57) ABSTRACT

A method and apparatus for adjusting circuit operation in response to physical orientation of an integrated circuit (IC) coupled to a host site via direct soldering or a socket. The IC can be installed in a correct orientation or rotated and installed in an incorrect orientation. The IC may have a square, substantially symmetric footprint and the incorrect orientation may correspond to 90 or 180 degree rotation of the IC from the correct orientation. The orientations may be discerned by sensing electrical characteristics of the installed IC. For example, the IC may ground a detection line when installed in the correct orientation, while the detection line may be floating when the IC is installed in an incorrect orientation. The IC may be switchably connected to other components such as a power supply only when it is detected as being installed in the correct orientation.

22 Claims, 4 Drawing Sheets

(51) Int. Cl.
*H05K 13/08* (2006.01)
*H05K 3/30* (2006.01)
*H05K 1/02* (2006.01)

(52) U.S. Cl.
CPC ........... *H05K 1/0268* (2013.01); *H05K 13/08* (2013.01); *H05K 2201/10151* (2013.01); *H05K 2201/10325* (2013.01); *H05K 2203/168* (2013.01); *Y02P 70/613* (2015.11); *Y10T 307/826* (2015.04)

(58) Field of Classification Search
CPC ...... H01R 23/68; H05K 1/0268; H05K 3/303; H05K 13/08; H05K 2201/10151; H05K 2201/10325; H05K 2203/168; Y10T 307/766; Y10T 307/826
USPC ......... 307/116, 125, 140; 324/538; 439/188, 439/488–490
See application file for complete search history.

(56) References Cited

U.S. PATENT DOCUMENTS

| | | | |
|---|---|---|---|
| 3,806,800 A * | 4/1974 | Bove | B82Y 15/00 324/538 |
| 4,418,971 A | 12/1983 | Liss | |
| 4,468,612 A | 8/1984 | Starr | |
| 4,621,419 A * | 11/1986 | Hino | H05K 13/0404 29/564.1 |
| 4,675,769 A | 6/1987 | Marshall et al. | |
| 4,730,156 A | 3/1988 | Matsuda | |
| 4,864,219 A * | 9/1989 | Parsons | G01R 31/2836 324/73.1 |
| 4,978,224 A | 12/1990 | Kishimoto et al. | |
| 5,126,910 A | 6/1992 | Windsor et al. | |
| 6,164,982 A | 12/2000 | Hama | |
| 6,417,718 B1 * | 7/2002 | Ota | H03K 17/6242 327/407 |
| 6,786,760 B1 * | 9/2004 | Benavides | H05K 7/1092 439/490 |
| 2003/0176013 A1 | 9/2003 | Baker | |
| 2003/0197263 A1 | 10/2003 | Hwang et al. | |
| 2012/0032684 A1 * | 2/2012 | Siddiquie | G01R 31/046 324/538 |
| 2012/0038367 A1 * | 2/2012 | Fefer | G01R 31/2853 324/538 |
| 2013/0115817 A1 | 5/2013 | Terlizzi | |
| 2013/0115821 A1 | 5/2013 | Golko et al. | |
| 2013/0117470 A1 | 5/2013 | Terlizzi et al. | |

OTHER PUBLICATIONS

Extended European Search Report dated Mar. 29, 2017 in European Patent Application No. 14850377.4.

* cited by examiner

METHOD AND APPARATUS FOR ELECTRICAL KEYING OF AN INTEGRATED CIRCUIT PACKAGE HAVING ROTATIONALLY SYMMETRIC FOOTPRINT

FIELD OF THE TECHNOLOGY

The present technology pertains in general to keying of integrated circuit packages and in particular to electrical keying of integrated circuit packages having a rotationally symmetric footprint.

BACKGROUND

Electronic devices generally include a host circuit board populated with components such as integrated circuits (ICs), which are provided in a variety of surface-mount or through-hole packages. ICs can be soldered directly onto the host printed circuit board (PCB) or mounted via a socket. It is generally important that each IC be oriented correctly on the host circuit board, so as to avoid damage at power-on.

This is an ongoing issue since most ICs have a rotationally symmetric footprint, that is, their electrical contacts (e.g. pins or pads) can physically align with corresponding connection locations (e.g. vias or pads) of the host circuit board for more than one rotational position of the IC. For example, in the case of a square IC with contacts on all four edges or in a grid pattern, the IC can be rotated in 90 degree increments and still align with its host connection location. In the case of a rectangular IC, the increments can be 180 degree increments. Although the footprint is physically rotationally symmetric, the IC pinout is not typically symmetric, and hence damage can occur if the IC is incorrectly oriented.

Correct IC orientation is typically addressed either by marking the host circuit board and IC so that the installer knows and follows the correct orientation, or by physically shaping the integrated circuit and host location to destroy symmetry, so that incorrect orientation is physically difficult or impossible to achieve. A typical example of such an arrangement includes "cutting" one corner off of a rectangular IC and "filling" the corresponding corner of its host socket, to inhibit mis-orientation.

Particularly for smaller ICs, marking can be difficult to see. Furthermore, physical symmetry-destroying features of small ICs may be too small to properly guard against mis-orientation since their size may be inadequate to resist a relatively small amount of insertion force.

Therefore there is a need for a means of guarding against mis-orientation of ICs that is not subject to one or more limitations of the prior art.

This background information is provided for the purpose of making known information believed by the applicant to be of possible relevance to the present technology. No admission is necessarily intended, nor should be construed, that any of the preceding information constitutes prior art against the present technology.

SUMMARY OF THE TECHNOLOGY

An object of the present technology is to provide a method and apparatus for electrical keying of an integrated circuit package having a rotationally symmetric footprint. In accordance with an aspect of the present technology, there is provided an electrical keying apparatus for an integrated circuit. The apparatus includes a detection module configured to monitor electrical conditions at a host site and to electrically differentiate between a correct orientation and an incorrect orientation of the integrated circuit when said integrated circuit is coupled to the host site, the incorrect orientation corresponding to rotation of the integrated circuit relative to the correct orientation and a switching module configured to switchably complete electrical connection between the integrated circuit and host circuitry when the detection module determines that the integrated circuit is in the correct orientation.

In accordance with another aspect of the present technology, there is provided a method for adjusting operation in response to physical orientation of an integrated circuit coupled to a host site. The method includes monitoring electrical conditions at the host site and electrically differentiating between a correct orientation and an incorrect orientation, respectively, of the integrated circuit when coupled to the host site, the incorrect orientation corresponding to rotation of the integrated circuit relative to the correct orientation. The method further includes allowing electrical connection between the integrated circuit and host circuitry upon making a determination that the integrated circuit is in the correct orientation.

BRIEF DESCRIPTION OF THE FIGURES

These and other features of the technology will become more apparent in the following detailed description in which reference is made to the appended drawings.

DETAILED DESCRIPTION OF THE TECHNOLOGY

Definitions

As used herein, the term "about" refers to a +/−10% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this technology belongs.

In various embodiments, an integrated circuit (IC) as described herein comprises a package, such as a plastic or ceramic package, with electrical leads, pins, solder balls, or other contacts designed for insertion into a host socket or soldering directly to a host printed circuit board. Various types of IC packages may be used as would be readily understood by a worker skilled in the art, such as but not limited to DIP, PGA, BGA, LGA, QFP, SOIC, LCC, BCC, and the like. The present technology is generally concerned with instances of such ICs or packaged ICs which have a footprint which is rotationally symmetric for given angles, such as 90 degrees or 180 degrees, although other angles may be possible. For example a hypothetical hexagonal package could be rotationally symmetric for 60 degree angular intervals.

In some embodiments, a rotationally symmetric footprint need not be 100% rotationally symmetric, but rather only sufficiently symmetric that the IC can potentially be installed in a wrong orientation. For example, one or more electrical connections may be missing from the footprint, for example by removal, in a manner which destroys the footprint's rotational symmetry. As another example, one or more additional electrical connections may be added to the footprint in a manner which destroys the footprint's rotational symmetry, while not necessarily effectively physically keying the IC.

The present technology provides a means for protecting circuitry in the event of improper installation of an IC on a host site, for example of a printed circuit board or a socket housed on a printed circuit board. If the IC is installed in its correct orientation, then certain electrical connections, such as power connections and/or signal connections, to the IC and/or other related circuits may be enabled, and otherwise these electrical connections may be disabled. Orientation detection is performed by sensing the electrical characteristics of certain electrical contacts (e.g. leads) of the IC when connected to the host, and determining whether those characteristics correspond to what is expected in the correct orientation.

Figure 1:
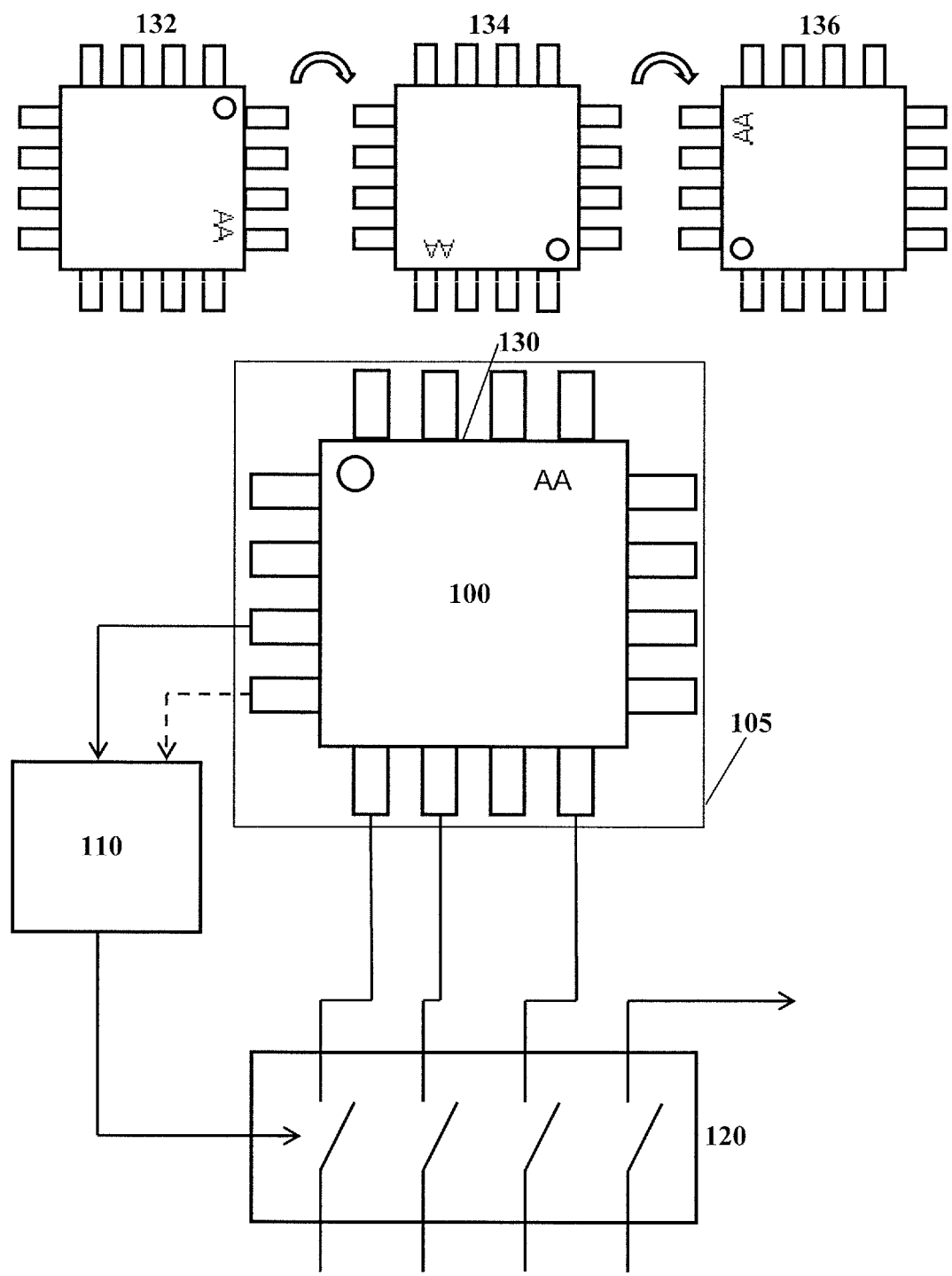
FIG. 1 illustrates an electrical keying apparatus in accordance with some embodiments of the technology.

In accordance with an aspect of the present technology, and with reference by way of non-limiting example to FIG. 1, there is provided an electrical keying apparatus for an integrated circuit 100. The apparatus includes a detection module 110 and a switching module 120. The detection module 110 is configured to differentiate between a correct orientation and an incorrect orientation, respectively, of the IC 100 when the IC is coupled to a host site 105 such as a socket or PCB site. FIG. 1 illustrates, by way of example, a correct orientation 130 and three incorrect orientations 132, 134, 136. Each incorrect orientation corresponds to a predetermined amount of rotation of the integrated circuit relative to the correct orientation, such as rotation about an axis perpendicular to the flat surface of the host PCB and host site. There may be multiple incorrect orientations corresponding to different amounts of rotation, but generally the IC can physically be coupled to the host site in an incorrect orientation but not successfully functionally coupled. In the correct orientation, electrical contacts of the integrated circuit align with electrical contacts of the host site in a correct correspondence. In the incorrect orientation, electrical contacts of the integrated circuit align with electrical contacts of the host site in an incorrect correspondence. The switching module 120 is configured to allow electrical connection between certain parts of the IC and host circuitry when the detection module determines that the integrated circuit is in the correct orientation. For example such electrical connection may be allowed only upon such a determination. The switching module may be configured to inhibit, for example switchably interrupt, electrical connection between the integrated circuit and host circuitry when the detection module determines that the integrated circuit is in the incorrect orientation. The switching module may more generally be configured to switchably make or break electrical connections related to various aspects of the host circuitry and/or IC depending on output of the detection module.

In various embodiments, the correct orientation is differentiated from the incorrect orientation by configuring the IC so that it causes a monitored detection line to be grounded only when the IC is in the correct orientation. The detection line may correspond to a PCB circuit trace which routes between an input of a monitoring circuit and a predetermined electrical contact of the host site. The IC is configured so that it completes a path between the detection line and a PCB ground when in the correct orientation. For example, the IC may have one of its ground contacts shorted directly to that contact of the IC which connects with the predetermined electrical contact of the host site when the IC is in the correct orientation. The monitoring circuit may be configured to trigger the switching module when the detection line is grounded. The switching module may switchably apply power to the IC, for example.

Figure 2:
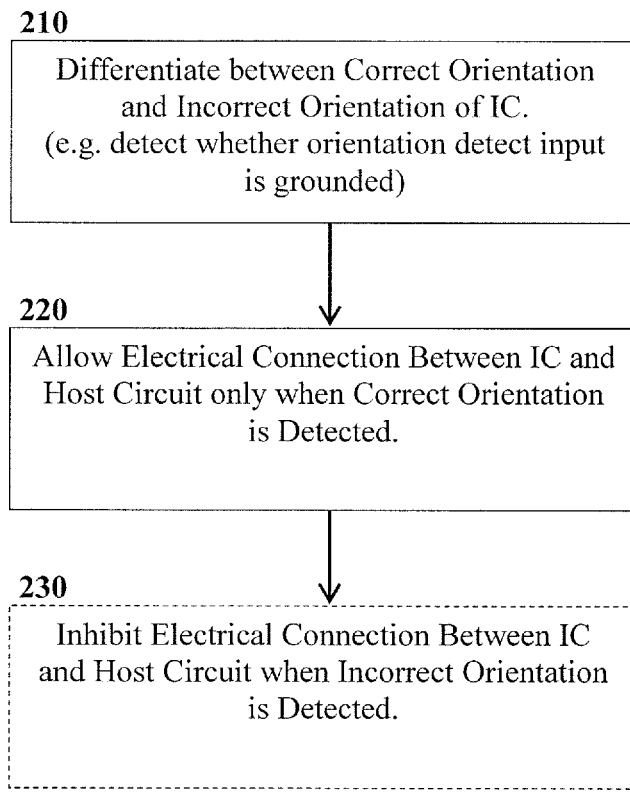
FIG. 2 illustrates a method for adjusting operation in response to physical orientation of an integrated circuit coupled to a host site, in accordance with some embodiments of the technology.

In accordance with another aspect of the present technology, and with reference to FIG. 2, there is provided a method for adjusting operation in response to physical orientation of an integrated circuit coupled to a host site. The method includes automatically differentiating 210 between a correct orientation and an incorrect orientation, respectively, of the IC when the IC is coupled to the host site such as a socket or PCB site. The incorrect orientation corresponds to a predetermined amount of rotation of the integrated circuit relative to the correct orientation, for example rotation about an axis perpendicular to the flat surface of the host PCB and host site. In the correct orientation, electrical contacts of the integrated circuit align with electrical contacts of the host site in a correct correspondence. In the incorrect orientation, the electrical contacts of the integrated circuit align with the electrical contacts of the host site in an incorrect correspondence. The method further includes automatically allowing 220 electrical connection between the integrated circuit and host circuitry, for example only when the detection module determines that the integrated circuit is in the correct orientation. The method may include automatically inhibiting 230 electrical connection between the integrated circuit and host circuitry upon making a determination that the integrated circuit is in the incorrect orientation. The method may be carried out for example via operation of hardware circuitry and possibly firmware or software controlled operation of associated computer processing circuitry. Such circuitry may be commensurate with the detection and switching modules as described herein.

In some embodiments, a socket is provided for coupling the IC to the host circuit board. The socket provides electrical connectivity with the IC without necessarily having to solder the IC in place. The IC may be removable from the socket. In some embodiments, the IC is coupled directly to the host circuit board, for example by soldering, without using an intermediate component such as a socket.

Various aspects of the present technology relate to an IC configured for use with the apparatus and/or method as described above, or to a system comprising such an IC and apparatus. In further embodiments, the above-described apparatus may be partially or wholly contained within the IC.

IC Footprint

As mentioned above, the IC includes a footprint which is substantially, but possibly not wholly, symmetric when rotated by predetermined amounts from a so-called "correct" position to one or more so-called "incorrect" positions. The rotation amounts may be in 90 degree increments or 180 degree increments, for example. The rotation amounts may be in smaller, larger, or different increments, depending on the angular symmetry of the IC. When the IC is in the correct position, each of its contacts aligns with a desired location on the host circuit board, at least some of these locations also including an electrical contact. The pairings of the IC's contacts with adjacent locations on the host circuit board are referred to as being in "correct correspondence." Adjacency in this respect relates to the contacts of the IC being positioned so that they can electrically mate (for example via subsequent soldering or friction fit) with corresponding contacts of the host circuit board, insofar as such corresponding contacts exist.

Each location (for example pad or via) of the host circuit board which is adjacent to a desired contact (or possibly non-conductive location devoid of contact) of the IC when in the correct position may also be adjacent to a different, undesired contact of the IC when in the incorrect position. Such undesired adjacencies are referred to as being in "incorrect correspondence." Further, for a given location of the host circuit board, the set of all contacts of the IC which can be in incorrect correspondence with that location (when the IC is in any of its incorrect positions) are referred to as "substitute" contacts for the desired contact.

Figure 3A:
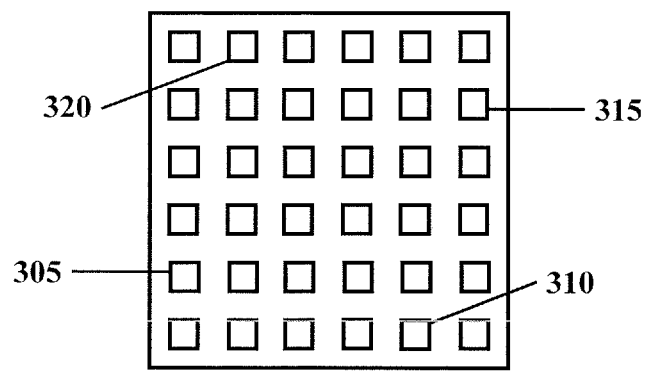
FIGS. 3a, 3b and 3c illustrate IC footprints provided in accordance with various embodiments of the technology.

FIG. 3a illustrates an example of an IC having a given electrical contact 305 along with three corresponding substitute electrical contacts 310, 315, 320, corresponding to 90 degree rotations of the IC.

In some embodiments, a predetermined electrical contact whose characteristics are to be sensed by the detection module may not correspond to any substitute contacts. Such embodiments may be achieved by locating the predetermined electrical contact such that, upon rotation of the IC, no substitute electrical contacts align with the former position of the predetermined electrical contact. The predetermined electrical contact may be added in a special position which does not correspond to substitute contacts, or other potential substitute contacts may be omitted or removed during manufacture of the IC.

Figure 3B:
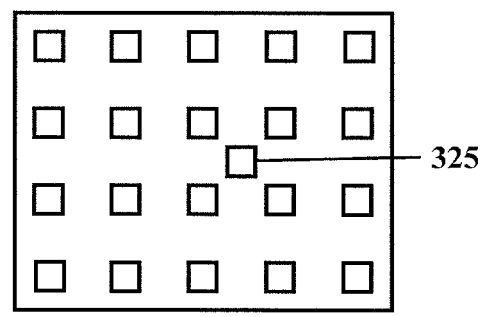
Figure 3C:
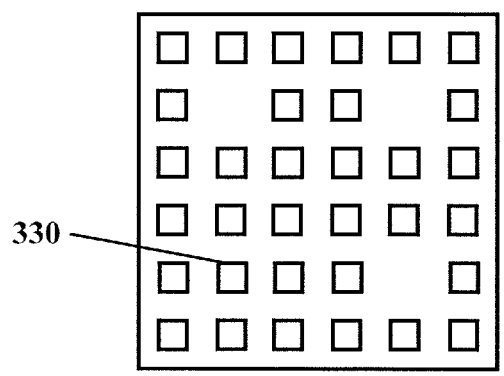

FIGS. 3b and 3c illustrate examples of ICs having given electrical contacts 325, 330 which do not correspond to any substitute electrical contacts upon rotation of the IC, due to the unique positions of the electrical contacts 325, 330.

Detection Module

In various embodiments, the detection module monitors electrical conditions at the host site, which are expected to exhibit certain electrical properties when the IC is installed in the correct orientation, and to exhibit other, detectably different properties when the IC is installed at the host site in an incorrect orientation. The monitored portions of the host site may correspond to electrical contacts such as solder lands, socket pins, electrically conductive apertures for receiving contacts of the IC, or the like. The detection module therefore includes input lines which lead to detection circuitry, such as voltage, current or impedance (typically but not necessarily purely resistive impedance) measurement, monitoring, or detection circuitry. The detection circuitry may incorporate or be coupled to logic circuitry, which adjusts its state based on the detected electrical properties. The output of the detection module may be as simple as a single binary value indicating whether or not the IC is installed in the correct orientation. In various embodiments, the detection module monitors for a ground condition presented by an input line, the ground condition indicative that the IC is installed in the correct orientation.

In some embodiments, the "correct" correspondence includes alignment of one or more predetermined electrical contacts of the host site with corresponding locations of the integrated circuit, thereby presenting a first electrical condition at said one or more predetermined electrical contacts. Likewise, the incorrect correspondence includes alignment of said one or more predetermined electrical contacts of the host site with different locations of the integrated circuit, thereby presenting a different electrical condition at said one or more predetermined electrical contacts. The detection module is configured to differentiate between the correct orientation and the incorrect orientation by differentiating between the first electrical condition and the different electrical condition(s).

In various embodiments, the first electrical condition is defined by the predetermined electrical contact of the host site being connected to ground. The connection to ground may be a direct connection or at least a connection having an impedance below a predetermined, generally low, threshold. The ground connection may be provided by connecting the predetermined electrical contact to a ground contact of the IC by way of a trace located within the IC. The ground contact will then be connected to ground through the host circuit board when the IC is installed in the correct orientation.

In order to facilitate detection, substitute contacts of the predetermined electrical contact (those that take the place of the predetermined electrical contact upon rotation) may generally be configured (individually or collectively) such that they exhibit a different electrical condition than the predetermined electrical contact would present when the IC is in the correct orientation. In the above case, each substitute contact should not be directly connected to ground, and should avoid being interpreted as being directly connected to ground. For example, these substitute electrical contacts may be used as high impedance signal inputs, or time-varying outputs (with the detection module configured to require signal stability over a longer cycle than the time variation), or the like. Thus, in some embodiments, these substitute contacts may still be used for certain functions and do not have to be open circuited or omitted.

In some embodiments, the first electrical condition is determined from the characteristics of one electrical contact, as above. In other embodiments, the first electrical condition is determined from the characteristics of plural electrical contacts. For example, the orientation may be determined to be correct if all of a plurality of electrical contacts present an expected "correct" electrical condition. This may increase reliability of the orientation detection by adding redundancy to the sensing circuitry. Additionally, it may not be necessary for all substitute contacts of every sensed electrical contact to exhibit different electrical characteristics, as long as the combination of substitute contacts collectively exhibit electrical characteristics which are different from those collectively exhibited by the predetermined electrical contacts. This may reduce constraints when designing the IC pinout.

Predetermined electrical conditions to be detected may be constant, for example ground conditions, connection to ground or supply voltage through a predetermined impedance, or the like. Alternatively, predetermined electrical conditions to be detected may be time varying, such as a time-varying, low-power test signal having an identifiable signature, which is injected into a first contact of the IC and read out of a second contact of the IC after being conveyed from the first contact to the second contact via a conductive trace between IC contacts, or other signal path having a predetermined impedance. In some embodiments, a constant or time-varying signal may be output by the IC when installed in the correct orientation, thereby confirming correct orientation.

Switching Module

In various embodiments, the switching module operates based on output of the detection module to switchably couple input and/or output contacts of the IC with corresponding other components, for example mounted on the host PCB. As a first example, the switching module may be configured to switchably route power from a power supply to a power input of the IC upon detecting that the IC is installed in the correct orientation, and otherwise to inhibit power from reaching the IC. This and other switching may be achieved by way of a transistor, relay, or the like. As another example, the switching module may be configured to switchably route all or selected signals to and/or from signal input and/or signal output pins, respectively, of the IC upon detecting that the IC is installed in the correct orientation, and otherwise to inhibit connection of such signal lines with the IC. This and other switching may be achieved by way of a transistor, relay, optical isolator, MEMS switch, fuse, fuse-controlled switch, or the like. It may be desirable to use a switching means that does not impact signal quality, delay, and/or other factors to a degree that would be detrimental to overall circuit performance.

In some embodiments, the switching module may additionally or alternatively operate to switchably connect and/or disconnect other elements of the host circuit board. For example, power to the entire host circuit board or a predetermined portion may be supplied only upon detection that the IC is installed in the correct orientation.

In some embodiments, once correct orientation of the IC has been detected, the switching module may be configured to thereafter always allow electrical connection between the integrated circuit and host circuitry. Similarly, the detection module may cease to function after correct orientation of the IC has been detected. Such "one-time use" embodiments may be particularly useful when the IC is soldered to the host, since orientation of the IC is not expected to change thereafter. This removes the detection and switching modules as potential points of failure. A reset may be provided to re-enable the detection module and reset the switching module in case of rework. Conceptually, such embodiments may be implemented by routing certain electrical connections with the IC through normally closed switches which are initially held open by the switching module by way of fused control lines. Operation of the switching module may then include interrupting the fuses to substantially permanently close the switches.

Location of Circuitry

In various embodiments, the majority of the enabling circuitry of the present technology is provided externally to the IC which is being electrically keyed. This may include all of the enabling circuitry except for the electrical contacts of the IC itself and internal components of the IC which provide for the electrical conditions to be sensed (for example internal connections between a predetermined contact on the IC and a ground contact of the IC). The enabling circuitry may be housed in one or more components of the host PCB, for example.

In some embodiments, the electrical keying circuitry may be partially or wholly housed in a socket configured for receiving the IC.

In some embodiments, the electrical keying circuitry may operate to electrically key plural ICs to be mounted to a host circuit board.

In some embodiments, a significant amount, and possibly substantially all, of the enabling circuitry of the present technology is provided internally to the IC which is being electrically keyed. That is, the IC may be substantially self-keying. For example, in this embodiment, the keying portion of the IC can to be tolerant to mis-orientation, and the functional portion of the IC can be protected from mis-orientation until the keying portion detects the correct orientation. The keying portion can have a power line in and an internal switch operated upon correct orientation detection, where the switch operates to route power to the functional portion. This configuration may potentially reduce the available pinout of the IC.

In some embodiments, the keying portion of the IC may comprise power and ground contacts which are capable of powering the keying portion even when the IC is in an incorrect orientation. For example, power and ground contacts may be provided in locations that will couple with corresponding power and ground contacts of the host when the IC is installed in an incorrect orientation. The keying portion of the IC may be electrically isolated from other components of the IC, so that the keying portion may be powered and operate without powering and operating said other components. In some embodiments, if the IC has multiple incorrect orientations, power and ground contacts for the keying portion may be provided which operate regardless of IC orientation.

In some embodiments, the present technology is provided as a collection of hardware components, such as transistors, logic components, analog components, and the like. The hardware components may implement the operation of the detection and switching modules directly as part of their structure. Alternatively, some of the functionality of the present technology may be provided as firmware, for comprising persistent electronic memory and program code instructions stored therein, the firmware being associated with a hardware component such as a microcontroller or microprocessor. The hardware component may execute firmware instructions in order to provide certain functionality in accordance with the present technology, such as logic operations or signal processing operations. Additionally or alternatively, some of the functionality of the present technology may be provided as software, for example located in electronic memory and associated with a hardware component such as a microcontroller or microprocessor. The hardware component may execute software instructions in order to provide certain functionality in accordance with the present technology, such as logic operations or signal processing operations.

In some embodiments, the detection module may be configured to trigger a notification system, for example a local or remote annunciators, alarms, lights, software reporting modules, or the like, either directly or via operation of switches. Such circuitry may be configured to indicate to a user or supervisory system or both, whether the IC is correctly or incorrectly oriented. For example, if the IC is incorrectly oriented, a light may be lit red, while if the IC is correctly oriented, a light may be lit green. Alternately the notification system may be activated only when the IC is in the correct orientation or in the incorrect orientation. In various embodiments, annunciation is performed via existing components, such as LEDs which are also used for one or more other purposes such as to indicate power on. Annunciation of an incorrect IC orientation may be performed by causing the notification system to operate in an identifiable way, for example by repeatedly flashing of a predetermined error code by an LED.

The technology will now be described with reference to specific examples. It will be understood that the following examples are intended to describe embodiments of the technology and are not intended to limit the technology in any way.

EXAMPLES

Figure 4:
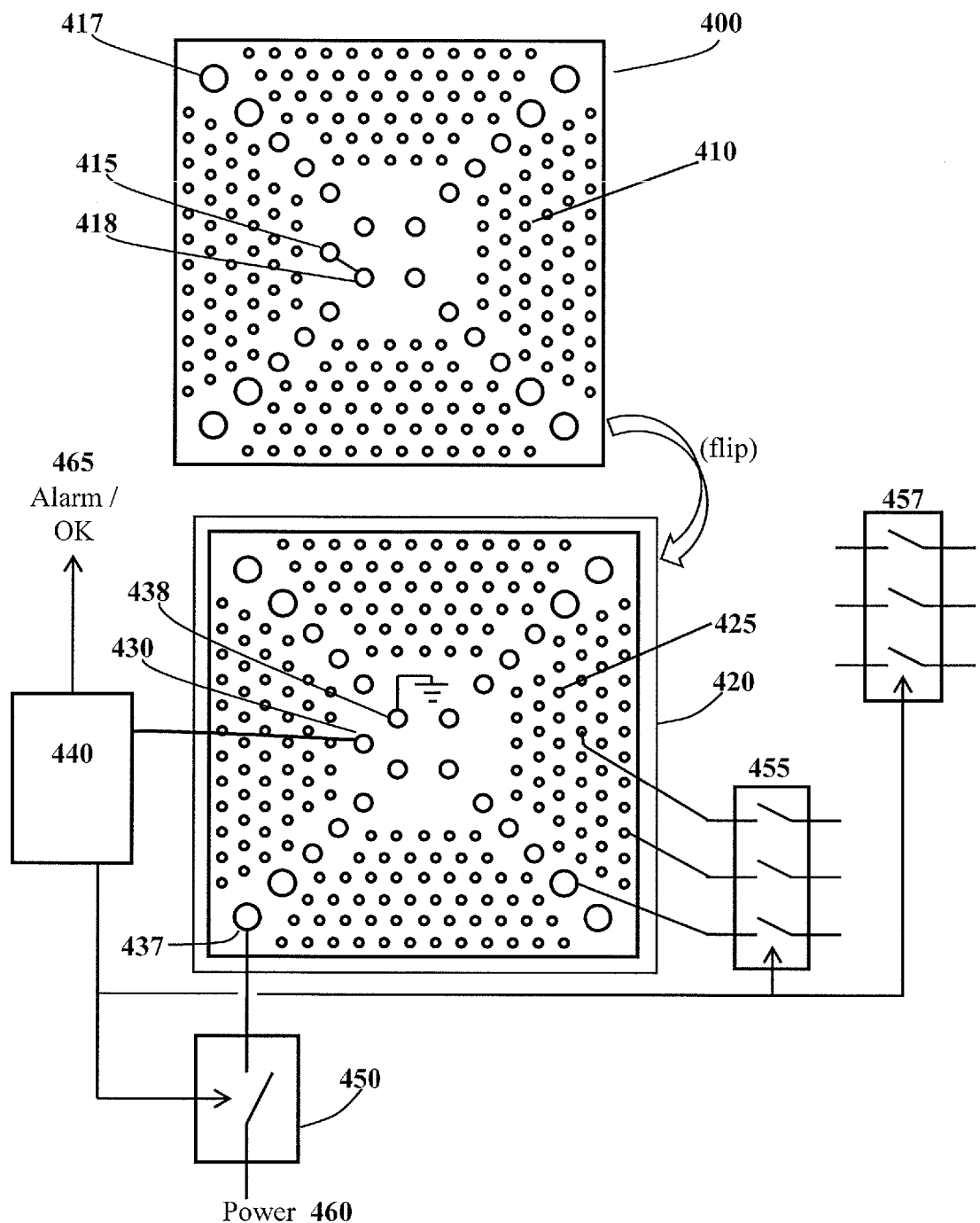
FIG. 4 illustrates a detailed representation of an electrical keying apparatus in accordance with an embodiment of the technology.

FIG. 4 illustrates an integrated circuit 400 (bottom view) provided in an LGA package having a plurality of lands 410 for electrically connecting the IC 400 with corresponding pins 425 of a socket 420 mounted on a PCB (top view). Alternatively, the socket may be omitted and the lands 410 of the IC 400 may be electrically connected to corresponding lands of the PCB. (These lands of the PCB may be represented in this alternative by drawing elements 425.) The lands 410 of the IC 400 and the corresponding pins 425 of the socket 420 are arranged in a generally symmetric fashion, with the exception of an orientation land 415 of the IC 400 and its corresponding orientation pin 430 of the socket 420. That is, while rotation of the IC in 90 degree increments from its correct orientation results in alignment of many of the IC lands 410 with socket pins 425 (or alternatively of PCB lands provided in place of the socket pins), the orientation pin 430 (or corresponding PCB land) only aligns with an IC land, namely the orientation land 415, when the IC is in its correct orientation. If the IC is in an incorrect orientation, the orientation pin 430 is in an electrically unconnected state since no other IC lands align with it.

As illustrated, the IC 400 receives power through land 417 and is grounded through land 418. Accordingly, corresponding pins 437 and 438 of the socket are routed to power and ground traces, respectively, of the PCB. The locations of the power and ground connections is given as an example and may be varied. When the IC is in the correct orientation, pin 437 aligns with land 417 and pin 438 aligns with land 418. Notably, in an incorrect orientation, power may be supplied to an incorrect land of the IC, which may lead to damage. As also illustrated, the orientation land 415 is electrically connected within the IC to the grounded land 418. As such, when the IC is in the correct orientation the orientation land 415 is also grounded. This in turn causes the orientation pin/land 430 of the socket/PCB to be grounded only when the IC is in the correct orientation. In short, correct orientation of the IC creates an electrical connection between the orientation pin 430 and the ground pin 438, via the IC 400. "Ground" voltage may be a true ground or a predetermined floating or non-floating reference voltage level, for example.

A detection module 440 is provided which monitors the voltage of the orientation pin 430. If the monitored voltage is a ground voltage, then the detection module 440 determines that the IC is correctly oriented. Means may be provided to inhibit the monitored voltage from reading as ground voltage under other conditions. For example, a relatively high-resistance pull-up resistor may be coupled to the pin 430.

The detection module 440 is configured to operate at least one switch 450 of a switching module, such that, when the detection module determines that the IC is correctly oriented (i.e. pin 430 is grounded) then the switch 450 is closed, and otherwise the switch 450 is opened. When closed, the switch 450 routes power from a power supply 460 to the power pin 437 of the socket and hence to the power pad 417 of the IC 400.

The detection module 440 may further be configured to operate one or more additional switches 455, which similarly close when the IC is correctly oriented. The additional switches, when closed, provide direct or indirect electrical connections between predetermined pins 425 of the socket 420 and other circuitry on or off the PCB. For example, in a case where an external connection to the board could provide power to a signal pin of the IC when in the incorrect orientation, these signals may be gated by the additional switches 455. This may facilitate avoidance of potential latch-up conditions of the IC, for example.

In some embodiments, the detection module 440 may further be configured to operate one or more additional switches 457, which similarly close when the IC is correctly oriented. The switches 457, when closed, provide direct or indirect electrical connections between other components of or related to the PCB and may be used to enable and disable other functionalities in response to correct or incorrect orientation of the IC 400.

In some embodiments, the detection module 440 may be configured to trigger a notification system 465, for example a local or remote annunciators, alarms, lights, software reporting modules, or the like, either directly or via operation of switches such as switches 457. Such circuitry may be configured to indicate (to a user and/or supervisory system) whether the IC 400 is correctly and/or incorrectly oriented. For example, if the IC is incorrectly oriented, a light may be lit red, while if the IC is correctly oriented, a light may be lit green.

It is obvious that the foregoing embodiments of the technology are examples and can be varied in many ways. Such present or future variations are not to be regarded as a departure from the spirit and scope of the technology, and all such modifications as would be obvious to one skilled in the art are intended to be included within the scope of the following claims.

We claim:

1. An electrical keying apparatus for an integrated circuit, the apparatus comprising:
    a. a detection module configured to monitor electrical conditions at a host site and to electrically differentiate between a correct orientation and an incorrect orientation of the integrated circuit when said integrated circuit is coupled to the host site, the incorrect orientation corresponding to rotation of the integrated circuit relative to the correct orientation; and
    b. a switching module configured to electrically connect the integrated circuit and host circuitry when the detection module determines that the integrated circuit is in the correct orientation and inhibit electrical connection between the integrated circuit and host circuitry when the integrated circuit is in an incorrect orientation thereby protecting the integrated circuit when the integrated circuit is incorrectly oriented.

2. The apparatus according to claim 1, wherein in the correct orientation electrical contacts of the integrated circuit align with electrical contacts of the host site in a correct correspondence, and in the incorrect orientation said electrical contacts of the integrated circuit align with said electrical contacts of the host site in an incorrect correspondence.

3. The apparatus according to claim 1, wherein, in the correct orientation, a first electrical condition is present at one or more predetermined electrical contacts of the host site due to electrical connection with one or more corresponding predetermined electrical contacts of the integrated circuit, and wherein, in the incorrect orientation, a different electrical condition is present at said one or more predetermined electrical contacts of the host site, and wherein the detection module is configured to differentiate between the correct orientation and the incorrect orientation by differentiating between the first electrical condition and the different electrical condition.

4. The apparatus according to claim 3, wherein the first electrical condition is a ground condition and the different electrical condition is an open circuit condition.

5. The apparatus according to claim 3, wherein the different electrical condition is an open circuit condition, and wherein the integrated circuit includes an asymmetric footprint which presents one of the corresponding predetermined electrical contacts of the integrated circuit for electrical connection with one of the predetermined electrical contacts of the host site when in the correct orientation, the asymmetric footprint further configured to present a portion of the integrated circuit devoid of electrical contacts to said one of the predetermined electrical contacts of the host site when in the incorrect orientation.

6. The apparatus according to claim 1, wherein, in the correct orientation, a first electrical condition is present at one or more predetermined electrical contacts of the integrated circuit due to electrical connection with corresponding predetermined electrical contacts of the host site, and wherein, in the incorrect orientation, a different electrical condition is present at said one or more predetermined electrical contacts of the integrated circuit due to electrical connection with different electrical contacts of the host site, and wherein the detection module is configured to differentiate between the correct orientation and the incorrect orientation by differentiating between the first electrical condition and the different electrical condition.

7. The apparatus according to claim 1, wherein the electrical contacts of the integrated circuit are arranged having a square footprint, and wherein the integrated circuit is capable of coupling to the host site in three incorrect orientations corresponding to: 90 degree rotation from the correct orientation; 180 degree rotation from the correct orientation; and 270 degree rotation from the correct orientation.

8. The apparatus according to claim 1, wherein the electrical contacts of the integrated circuit are arranged having a rectangular footprint, and wherein the integrated circuit is capable of coupling to the host site in the incorrect orientation corresponding to 180 degree rotation from the correct orientation.

9. The apparatus according to claim 1, wherein the switching module is configured to switchably complete: an electrical power connection to the integrated circuit, a signal connection to the integrated circuit, a signal connection from the integrated circuit, an electrical power connection to another component associated with the integrated circuit, a signal connection with another component associated with the integrated circuit, or a combination thereof.

10. The apparatus according to claim 1, further comprising an annunciation circuit configured to indicate orientation of the integrated circuit to a user.

11. The apparatus according to claim 1, wherein the host site is a socket configured to receive the integrated circuit or a set of printed circuit board lands configured to receive the integrated circuit by soldering.

12. A method for adjusting operation in response to physical orientation of an integrated circuit coupled to a host site, the method comprising:
   a. monitoring electrical conditions at the host site;
   b. electrically differentiating between a correct orientation and an incorrect orientation, respectively, of the integrated circuit when coupled to the host site, the incorrect orientation corresponding to rotation of the integrated circuit relative to the correct orientation; and
   c. allowing electrical connection between the integrated circuit and host circuitry upon making a determination that the integrated circuit is in the correct orientation and inhibiting electrical connection between the integrated circuit and host site when the integrated circuit is in an incorrect orientation thereby protecting the integrated circuit when the integrated circuit is incorrectly oriented.

13. The method according to claim 12, wherein in the correct orientation electrical contacts of the integrated circuit align with electrical contacts of the host site in a correct correspondence, and in the incorrect orientation said electrical contacts of the integrated circuit align with said electrical contacts of the host site in an incorrect correspondence.

14. The method according to claim 12, wherein, in the correct orientation, a first electrical condition is present at one or more predetermined electrical contacts of the host site due to electrical connection with one or more corresponding predetermined electrical contacts of the integrated circuit, and wherein, in the incorrect orientation, a different electrical condition is present at said one or more predetermined electrical contacts of the host site, and wherein the method further comprises differentiating between the correct orientation and the incorrect orientation by differentiating between the first electrical condition and the different electrical condition.

15. The method according to claim 14, wherein the first electrical condition is a ground condition and the different electrical condition is an open circuit condition.

16. The method according to claim 14, wherein the different electrical condition is an open circuit condition, and wherein the integrated circuit includes an asymmetric footprint which presents one of the corresponding predetermined electrical contacts of the integrated circuit for electrical connection with one of the predetermined electrical contacts of the host site when in the correct orientation, the asymmetric footprint further configured to present a portion of the integrated circuit devoid of electrical contacts to said one of the predetermined electrical contacts of the host site when in the incorrect orientation.

17. The method according to claim 12, wherein, in the correct orientation, a first electrical condition is present at one or more predetermined electrical contacts of the integrated circuit due to electrical connection with corresponding predetermined electrical contacts of the host site, and wherein, in the incorrect orientation, a different electrical condition is present at said one or more predetermined electrical contacts of the integrated circuit due to electrical connection with different electrical contacts of the host site, and wherein the method further comprises differentiating between the correct orientation and the incorrect orientation by differentiating between the first electrical condition and the different electrical condition.

18. The method according to claim 12, wherein the electrical contacts of the integrated circuit are arranged having a square footprint, and wherein the integrated circuit is capable of coupling to the host site in three incorrect orientations corresponding to: 90 degree rotation from the correct orientation; 180 degree rotation from the correct orientation; and 270 degree rotation from the correct orientation.

19. The method according to claim 12, wherein the electrical contacts of the integrated circuit are arranged having a rectangular footprint, and wherein the integrated circuit is capable of coupling to the host site in the incorrect orientation corresponding to 180 degree rotation from the correct orientation.

20. The method according to claim 12, further comprising switchably completing an electrical power connection to: the integrated circuit, a signal connection to the integrated circuit, a signal connection from the integrated circuit, an electrical power connection to another component associated with the integrated circuit, a signal connection with another component associated with the integrated circuit, or a combination thereof.

21. The method according to claim 12, further comprising indicating orientation of the integrated circuit to a user.

22. The method according to claim 12, wherein the host site is a socket configured to receive the integrated circuit or a set of printed circuit board lands configured to receive the integrated circuit by soldering.

* * * * *